US006841468B2

(12) United States Patent
Friedemann et al.

(10) Patent No.: US 6,841,468 B2
(45) Date of Patent: Jan. 11, 2005

(54) METHOD OF FORMING A CONDUCTIVE BARRIER LAYER HAVING IMPROVE ADHESION AND RESISTIVITY CHARACTERISTICS

(75) Inventors: Michael Friedemann, Dresden (DE); Volker Kahlert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/602,484

(22) Filed: Jun. 24, 2003

(65) Prior Publication Data

US 2004/0137714 A1 Jul. 15, 2004

(30) Foreign Application Priority Data

Dec. 31, 2002 (DE) .......................... 102 61 466

(51) Int. Cl.[7] .......................................... H01L 21/4763
(52) U.S. Cl. ...................... 438/627; 438/628; 438/648; 438/653; 438/654; 438/656; 438/658; 438/676; 438/685
(58) Field of Search ................. 438/627–628, 438/648, 653–654, 656, 658, 676, 685

(56) References Cited

U.S. PATENT DOCUMENTS

| 5,654,233 | A | | 8/1997 | Yu ............................. 438/643 |
|---|---|---|---|---|
| 5,933,753 | A | * | 8/1999 | Simon et al. ................ 438/629 |
| 5,985,759 | A | | 11/1999 | Kim et al. ................... 438/653 |
| 6,080,285 | A | | 6/2000 | Liu et al. ................. 204/192.12 |
| 6,176,983 | B1 | | 1/2001 | Bothra et al. ........... 204/192.17 |
| 6,217,721 | B1 | * | 4/2001 | Xu et al. ................ 204/192.17 |
| 6,303,490 | B1 | | 10/2001 | Jeng ............................. 438/627 |
| 6,316,360 | B1 | | 11/2001 | Burton et al. ............... 438/679 |
| 6,342,448 | B1 | | 1/2002 | Lin et al. .................... 438/687 |
| 6,387,800 | B1 | | 5/2002 | Liu et al. .................... 438/653 |
| 6,440,831 | B1 | | 8/2002 | Klatt et al. ................. 438/597 |
| 6,495,921 | B1 | * | 12/2002 | Burton et al. ............... 257/774 |
| 6,508,919 | B1 | | 1/2003 | Licata et al. ................ 438/627 |
| 6,624,062 | B2 | * | 9/2003 | Miyamoto ................. 438/623 |
| 6,673,716 | B1 | * | 1/2004 | D'Couto et al. ........... 438/656 |
| 6,720,253 | B2 | * | 4/2004 | Wada et al. ................ 438/637 |
| 2002/0041028 | A1 | | 4/2002 | Choi et al. .................. 257/751 |
| 2002/0060363 | A1 | * | 5/2002 | Xi et al. ..................... 257/751 |
| 2002/0084181 | A1 | | 7/2002 | Gopalraja et al. ..... 204/192.12 |
| 2003/0162391 | A1 | * | 8/2003 | Donohue et al. ........... 438/685 |

* cited by examiner

*Primary Examiner*—Lynne A. Gurley
(74) *Attorney, Agent, or Firm*—Williams, Morgan & Amerson

(57) ABSTRACT

The adhesion properties of a metal interconnect structure are enhanced by selectively depositing a barrier layer component having good adhesion to an underlying metal on the bottom surface of a via. Then, a further barrier layer having superior adhesion characteristics for the dielectric is formed on the dielectric sidewalls of the via, so that excellent adhesion to the dielectric and the underlying metal is achieved. The selectivity of the deposition may be accomplished by exploiting the capabilities of modem IPVD tools.

24 Claims, 4 Drawing Sheets

METHOD OF FORMING A CONDUCTIVE BARRIER LAYER HAVING IMPROVE ADHESION AND RESISTIVITY CHARACTERISTICS

BACKGROUND OF THE INVENTION

1. Field of the Invention

The present invention generally relates to the field of fabrication of integrated circuits, and, more particularly, to the formation of an interconnection requiring the provision of a barrier layer between a bulk metal and a dielectric in which the interconnection is embedded.

2. Description of the Related Art

In an integrated circuit, a huge number of circuit elements, such as transistors, capacitors, resistors, and the like, are formed in or on an appropriate substrate, usually in a substantially planar configuration. Due to the large number of circuit elements and the required complex layout of the integrated circuits, generally the electrical connection of the individual circuit elements may not be established within the same level on which the circuit elements are manufactured, but requires one or more additional "wiring" layers, also referred to as metallization layers. These metallization layers generally include metal lines, providing for the interlevel electrical connection, and also include a plurality of inter-level connections, also referred to as vias, wherein the metal lines and vias may also be commonly referred to as interconnects.

Due to the continuous shrinkage of the feature sizes of circuit elements in modern integrated circuits, the number of circuit elements for a given chip area, that is the package density, also increases, thereby requiring an even larger increase in the number of electrical interconnections to provide for the desired circuit functionality. Therefore, the number of stacked metallization layers increases as the number of circuit elements per chip area becomes larger. Since the fabrication of a plurality of metallization layers entails extremely challenging issues to be solved, such as mechanical, thermal and electrical reliability of up to twelve stacked metallization layers that are required, for example, for sophisticated aluminum-based microprocessors, semiconductor manufacturers are increasingly replacing the well-known metallization metal aluminum by a metal that allows higher current densities and hence allows reduction of the dimensions of the interconnections. For example, copper is a metal generally considered to be a viable candidate for replacing aluminum due to its superior characteristics in view of higher resistance against electromigration and significantly lower electrical resistivity when compared with aluminum. In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. In manufacturing metallization layers including copper, the so-called damascene technique is therefore preferably used wherein a dielectric layer is first applied and then patterned to receive trenches and vias, which are subsequently filled with copper. A further major drawback of copper is its property to readily diffuse in silicon dioxide, which is a well-established and approved dielectric material in fabricating integrated circuits.

It is therefore necessary to employ a so-called barrier material in combination with a copper-based metallization to substantially avoid any out-diffusion of copper into the surrounding dielectric material, as copper may readily migrate to sensitive semiconductor areas, thereby significantly changing the characteristics thereof. The barrier material provided between the copper and the dielectric material should, however, in addition to the required barrier characteristics, exhibit good adhesion to the dielectric material as well as to the copper and should also have as low an electrical resistance as possible so as to not unduly compromise the electrical properties of the interconnection. It turns out, however, that a single material may not readily meet the requirements imposed on a desired barrier material. For example, a bi-layer comprised of tantalum and tantalum nitride are frequently used as barrier materials in combination with a copper damascene metallization layer. Tantalum, which effectively blocks copper atoms from diffusing into an adjacent material even when provided in extremely thin layers, however, exhibits only a poor adhesion to silicon dioxide based dielectrics, so that a copper interconnection including a tantalum barrier layer may suffer from reduced mechanical stability especially during the chemical mechanical polishing of the metallization layer, which is required for removing excess copper and planarizing the surface for the provision of a further metallization layer. The reduced mechanical stability during the CMP may, however, entail severe reliability concerns in view of reduced thermal and electrical conductivity of the interconnections. On the other hand, tantalum nitride exhibits excellent adhesion to silicon dioxide based dielectrics, but has very poor adhesion to copper. Consequently, in advanced integrated circuits having a copper-based metallization, typically a barrier bi-layer of tantalum nitride/tantalum is used, as will be described in more detail with reference to FIGS. 1a–1c.

In FIG. 1a, a metallization structure 100 comprises a substrate 101, for example, a semiconductor substrate bearing a plurality of individual circuit elements (not shown), such as transistors, resistors, capacitors, and the like. The substrate 101 is to represent any type of appropriate substrate with or without any additional circuit elements and may, in particular, represent sophisticated integrated circuit substrates having included therein circuit elements with critical feature sizes in the deep submicron regime. A first dielectric layer 102 is formed above the substrate 101 and includes a metal interconnection 104 comprised of a metal line 103, such as a copper line, and a first barrier layer 106 comprised of tantalum, and a second barrier layer 105 comprised of tantalum nitride. The dielectric layer 102 and the metal interconnection 104 may represent a first metallization layer. A second dielectric layer 107 comprised of silicon dioxide or a silicon dioxide based dielectric material is formed over the first dielectric layer 102 and has formed therein a trench 109 and a via 108 connecting to the metal line 103. A first barrier layer 110 is formed on inner surfaces of the via 108 and the trench 109.

A typical process flow for forming the metallization structure 100 as shown in FIG. 1a may include the following steps, wherein, for the sake of simplicity, only the formation of the second metallization layer, i.e., of the second dielectric layer 107 and the metal interconnection to be formed therein, will be described in detail as the processes in forming the metal interconnection 104 in the first dielectric layer 102 may substantially involve the same process steps. Thus, after planarizing the dielectric layer 102, including the metal interconnection 104, the dielectric layer 107 is deposited by well-known deposition methods, such as plasma-enhanced CVD, wherein typically an etch stop layer (not shown) may be deposited prior to the formation of the second dielectric layer 107. Subsequently, the dielectric layer 107 is patterned by well-known photolithography and anisotropic etch techniques, wherein an intermediate etch stop layer (not shown) may be used in patterning the trench 109. It should be further noted that different approaches may be employed in forming the trench 109 and the via 108, such as a so-called via first, trench last approach, or a trench first, via last approach, wherein, in the former approach, the via 108 may be filled with metal prior to the formation of the trench 109. In the present example, a so-called dual damascene technique is described in which the trench 109 and the via 108 are simultaneously filled with metal. After the formation of the via 108 and the trench 109, the first barrier layer 110, comprised of tantalum nitride, is deposited by advanced physical vapor deposition (PVD) or ionized PVD (IPVD) techniques. Generally, the deposition of the thin barrier layer 110, typically with a thickness in the range of approximately 30–50 nm, in a reliable manner throughout the entire inner surfaces of the trench 109 and the via 108, wherein in particular the via 108 may have a large aspect ratio, requires advanced sputter tools that allow effective control of the directionality of the target atoms. An appropriate sputter tool will, in principle, be described later with reference to FIG. 3. Generally, it is desirable to select the deposition parameters so as to obtain a reliable coverage of the sidewalls and bottom surfaces of the trench 109 and the via 108 at a minimum thickness of the layer 110 so that only a minimum amount of space is "consumed" by the layer 110. Increasing the thickness of the barrier layer 110 would otherwise unduly compromise the electrical conductivity of the interconnection to be formed in the via 108 and the trench 109, especially when the feature sizes of the via 108 are scaled to 0.2 $\mu$m and less.

FIG. 1b schematically shows the metallization structure 100 with a second barrier layer 111 followed by a copper seed layer 112 formed on the structure 100 and within the trench 109 and the via 108. As previously noted, due to the superior adhesion characteristics of tantalum with regard to copper, the second barrier layer 111 is substantially comprised of tantalum so that in combination a desired high degree of adhesion is obtained to the surrounding dielectric material of the layer 107. The second barrier layer 111 may be deposited within the same sputter tool as the first barrier layer 110, wherein the supply of nitrogen is discontinued so as to substantially deposit tantalum instead of tantalum nitride. Thereafter, the copper seed layer 112 is deposited by sputter deposition, wherein a different deposition tool or a tool adapted to deposit tantalum and copper is used. The provision of the copper seed layer 112 may be advantageous in view of the crystallinity of the subsequently electrochemically deposited bulk copper compared to a direct provision of the copper on the tantalum barrier layer 111. Next, copper is deposited on the metallization structure 100, for example, by electroplating, in an amount to reliably fill the via 108 and the trench 109. Since reliable filling of the trench 109 requires a certain amount of "over-fill," the excess copper has to be removed along with the first and second barrier layers 110, 111 so as to reliably insulate adjacent trenches 109 from each other. The removal of the excess material and the simultaneous planarization of the structure 100 is typically accomplished by CMP, wherein the superior overall adhesion characteristics of the combined first and second barrier layers 110, 111 allow the polishing of the structure 100 substantially without any issues regarding the mechanical stability of the inlaid copper in the trench 109 and the via 108.

FIG. 1c schematically shows the metallization structure 100 after completion of the above-described process sequence. Copper 113 is filled in the trench 109 and the via 108 and the excess metal of the barrier layers 110, 111 and of the copper 113 is removed to provide a substantially planar surface 115 for receiving a further metallization layer or a final passivation layer. Although the metallization structure 100 exhibits good adhesion characteristics while at the same time substantially preventing out-diffusion of copper into the surrounding dielectric layer 107, it is evident that at an interface 114 between the copper 103 and the copper 113 in the via 108, tantalum nitride of the layer 110 is directly in contact with the copper 103, thereby causing possible adhesion issues owing to the poor adhesion of tantalum nitride to copper. The reduced adhesion of the barrier layer 110 on the copper 103 may lead to a significantly increased transition resistance due to partial delamination or due to a void formation at the interface 114, thereby significantly negatively affecting the device's reliability and performance.

In view of the above-identified problems, there is a need for an improved barrier layer allowing the formation of more reliable metal interconnections, especially of copper interconnections.

SUMMARY OF THE INVENTION

Generally, the present invention is directed to an improved barrier layer technique in which substantially all of the interfaces of a metal interconnection to the surrounding materials have improved adhesion characteristics. In particular, at the bottom surfaces of damascene metallization structures, the deposition characteristics in manufacturing the barrier layer are controlled in such a manner that an improved barrier layer structure having the required adhesion qualities is obtained. To this end, process parameters during the sputter deposition of the barrier material are controlled to deposit a first component preferentially at the bottom surface without unduly contaminating the sidewall areas.

In accordance with one illustrative embodiment of the present invention, a method of forming a barrier layer in an interconnect structure formed on a substrate comprises adjusting a direction of target atoms in a deposition ambient by ionizing a fraction of the target atoms and applying a bias voltage to the interconnect structure so as to predominantly deposit target ions on a bottom surface of the interconnect structure to form a bottom barrier layer. Then, a composition of the deposition ambient is changed while reducing the bias voltage to deposit a second barrier layer on sidewalls of the interconnect structure. Next, the deposition ambient is substantially re-established and target atoms are conformally deposited to form a third barrier layer over the bottom barrier layer and the second barrier layer.

According to another illustrative embodiment of the present invention, a method of forming a tantalum-based barrier layer comprises the deposition of tantalum by ionized physical vapor deposition primarily at a bottom surface of a via. Moreover, a tantalum nitride/tantalum bi-layer is deposited on sidewalls of the via.

According to a further illustrative embodiment, a metallization structure in an integrated circuit comprises a first metal region formed in a first dielectric layer and a second metal region formed above the first metal region in a second dielectric layer. A barrier layer stack includes a first sub-layer and a second sub-layer and separates the second metal region from the second dielectric layer and the first metal region, wherein the first sub-layer is in contact with the second dielectric layer, and the second sub-layer is in contact with the first metal region.

In accordance with still another illustrative embodiment of the present invention, a metallization structure includes a first copper region embedded in a dielectric material and a second copper region embedded in a dielectric material, wherein a barrier layer connecting the first and second copper regions differs from the barrier layer separating the second copper region from the dielectric material.

BRIEF DESCRIPTION OF THE DRAWINGS

The invention may be understood by reference to the following description taken in conjunction with the accompanying drawings, in which like reference numerals identify like elements, and in which.

Figure 1A:
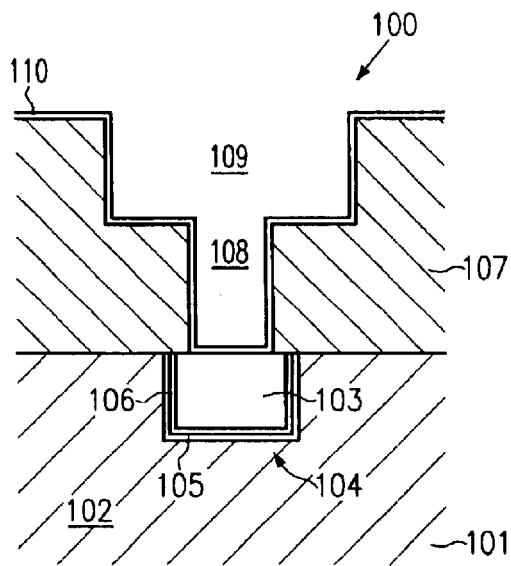
FIGS. 1a–1c schematically show cross-sectional views of a conventional copper-containing metallization structure during the various manufacturing stages.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, ie., a meaning other than that understood by skilled artisans, such a special definition will be expressly set forth in the specification in a definitional manner that directly and unequivocally provides the special definition for the term or phrase.

In the following illustrative embodiments, a barrier layer on the basis of tantalum and tantalum nitride is referred to since these materials currently appear to be the most promising candidates for manufacturing copper-based metallization layers. Certain aspects of the present invention may, however, be applied to other barrier materials, such as titanium/titanium nitride based barrier layers, or barrier layers requiring the incorporation of three or more components when device requirements may necessitate barrier and adhesion characteristics other than those provided by a tantalum/tantalum nitride based barrier layer. Moreover, although the present invention is especially advantageous when applied to copper-based metallization layers, other metals may be used if appropriate for specified applications. Thus, the present invention should not be considered as limited to any particular embodiment disclosed herein unless such limitations are expressly set forth in the appended claims.

Figure 2A:
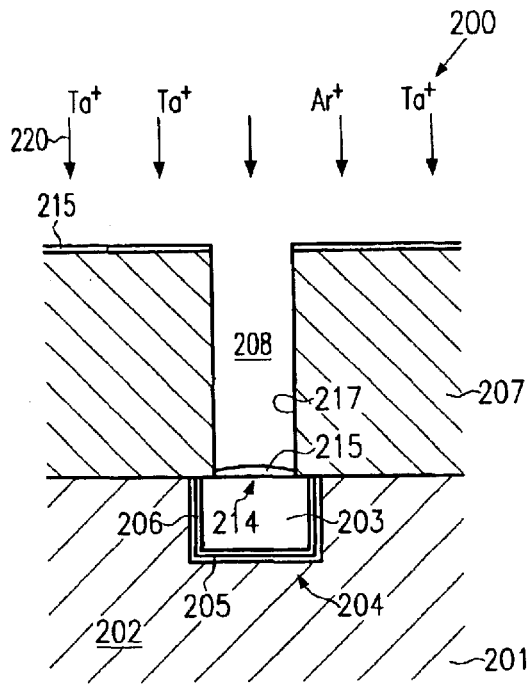
FIGS. 2a–2d schematically show cross-sectional views of a metallization structure during the various manufacturing stages in accordance with illustrative embodiments of the present invention.

Further illustrative embodiments of the present invention will now be described in more detail. In FIG. 2a, a metallization structure 200 comprises a substrate 201 having formed thereon a first dielectric layer 202 containing a metal line 204 comprised of a metal region 203, including, for instance, copper, a first barrier layer 205 and a second barrier layer 206. A second dielectric layer 207 is formed above the first dielectric layer 202, wherein a via 208 connecting to the metal region 203 is formed in the dielectric layer 207. A bottom barrier layer 215 is formed at an interface 214 between the via 208 and the metal region 203. The bottom barrier layer 215 is also provided on top of the dielectric layer 207, whereas sidewalls 217 of the via 208 are only minimally covered or are substantially without material of the bottom barrier layer 215. In one particular embodiment, the bottom barrier layer 215 is substantially comprised of tantalum.

A typical process flow for forming the structure 200 includes the following process steps. After completion of the metal line 204 in the first dielectric layer 202, the second dielectric layer 207, which in one embodiment is a silicon dioxide based dielectric material, or which in other cases may be a silicon and oxygen-containing dielectric material, for example a low-k dielectric material, is deposited, wherein an additional etch stop layer (not shown) may be deposited prior to the formation of the dielectric layer 207. Subsequently, the via 208 is formed by appropriate photolithography and anisotropic etch techniques, which may include process steps as previously described with reference to FIG. 1a. Thereafter, the bottom barrier layer 215 is formed by sputter deposition, as indicated by reference number 220, wherein process parameters of the sputter process are adjusted to obtain a substantially perpendicular incidence of the tantalum ions with respect to the surface of the structure 200. Thus, the deposition of the bottom barrier layer 215 is substantially restricted to horizontal portions (with respect to the substrate 201), such as the interface 214 between the via 208 and the metal region 203.

Figure 3:
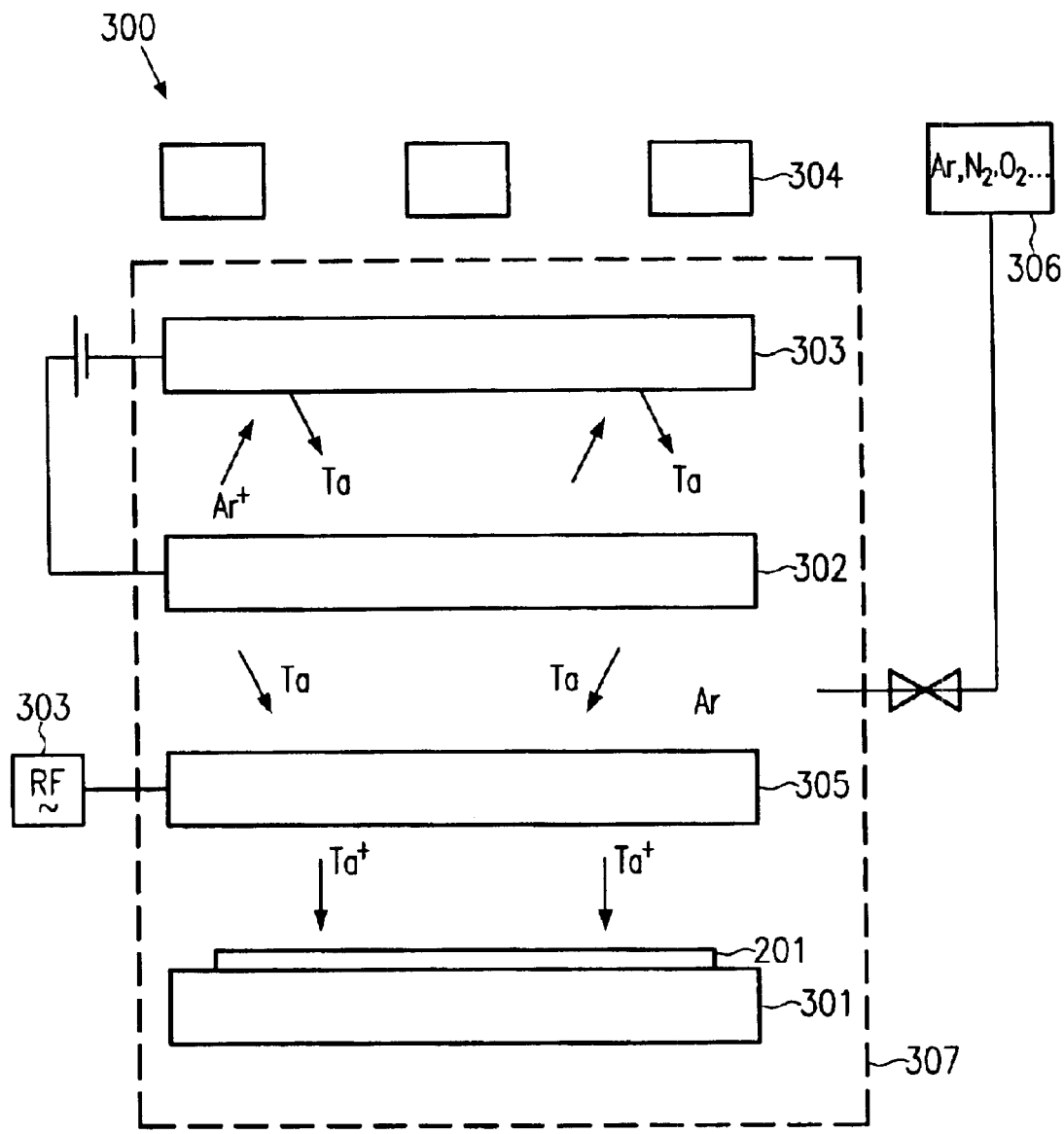
FIG. 3 schematically illustrates a deposition tool as may be employed for forming the barrier layer of the metallization structures as shown in FIGS. 2a–2d and 4a–4b.

An appropriate sputter deposition tool will now be described in more detail with reference to FIG. 3. In FIG. 3, a process chamber 307 includes a substrate holder 301 that is configured to receive a substrate, such as the substrate 201, and may further be adapted to provide a stabilized temperature and to allow the application of a bias voltage in the form of high frequency voltage or DC voltage, wherein, for the sake of simplicity, corresponding means are not shown. Furthermore, a plasma generation means 302 is provided in the vicinity of a sputter target 303, which may be substantially comprised of a plate including the desired target material, such as tantalum. The target 303 may include corresponding cool elements required for maintaining the sputter target 303 below a specified temperature. A respective plasma excitation generator, for example in the form of an RF generator and/or a DC generator (not shown), is connected to the plasma generating means 302 and the sputter target 303 so that a plasma may be maintained in the vicinity of the sputter target 303. Typically, a magnet assembly 304 is provided so as to enhance the efficiency of the plasma in the vicinity of the sputter target 303 and improve target utilization. Ionization means 305 connected to an appropriate excitation source, such as an RF generator or a DC voltage source, are arranged between the plasma generating means 302 and the substrate holder 301. Moreover, a gas source 306 is provided and configured to supply one or more gases to the process chamber 307 to thereby establish a required gas ambient. Any means for maintaining a required pressure, temperature and the like within the process chamber 307 are typically provided in modern IPVD tools and are not shown in FIG. 3. Furthermore, depending on a specific type of sputter tool 300, the geometry within the process chamber 307 may significantly vary and therefore process parameters during operation of the sputter tool 300 have to be selected on the basis of the specifics of the process chamber 307. In one embodiment, the present invention may be employed with a sputter deposition tool with a hollow cathode configuration available from Novellus Inc.

In forming the bottom barrier layer 215, the substrate 201 is inserted into the process chamber 307 and an appropriate atmosphere is established within the process chamber 307. For example, argon may be supplied to the process chamber 307 so as to establish a specified pressure in the chamber 307. Moreover, the temperature of the substrate 201 may be adjusted to an appropriate value and a bias voltage is applied to the substrate 201, required for the subsequent deposition of tantalum to form the bottom barrier layer 215. By energizing the plasma generating means 302, a plasma is generated or charged particles of an already existent plasma are accelerated towards the sputter target 303. The target atoms, that is the tantalum atoms, liberated from the sputter target 303 will finally approach the ionization means 305 and may then be accelerated towards the substrate 201 due to the applied bias voltage. The bias voltage establishes a highly uniformly oriented ion bombardment, wherein the tantalum atoms and argon atoms, depending on the ratio of tantalum and argon atoms within the process chamber 307, are driven towards the substrate 201 on substantially perpendicular trajectories. Therefore, tantalum is deposited preferentially at horizontal surface portions, such as the interface 214 within the via 208. The "selectivity" or bottom coverage of tantalum deposition, i.e., the deposition of tantalum, on the sidewalls 217 in relation to the interface 214, substantially depends on the applied bias voltage and may also be influenced by the chamber pressure, the substrate temperature, and the like. In particular, the applied bias voltage has to be selected in conformity with the specifics of the process chamber 307 to obtain the desired deposition selectivity. Suitable parameter values may be obtained by experiment by varying the bias voltage and/or the chamber pressure and/or the chamber geometry, i.e., the distance of the ionization means 305 from the substrate holder 301, the substrate temperature, and the like, for a specified type of metallization structure. Typically, a deposition selectivity of approximately 3–10 may be obtained by appropriately adjusting the above-identified process parameters, especially the bias voltage, in presently available sputter tools for ionized physical vapor deposition. Once the process parameter setting for a required deposition selectivity is established, a time interval of the tantalum deposition in the range of approximately 2–10 seconds allows the formation of the bottom barrier layer 215 within the via 208 with an average thickness of approximately 2–5 nm for a via 208 having an aspect ratio of 5 and more.

Subsequently, nitrogen is supplied to the process chamber 307 and the bias voltage is discontinued or at least significantly reduced to decrease the degree of directionality of the ions deposited on the substrate 201.

Figure 2B:
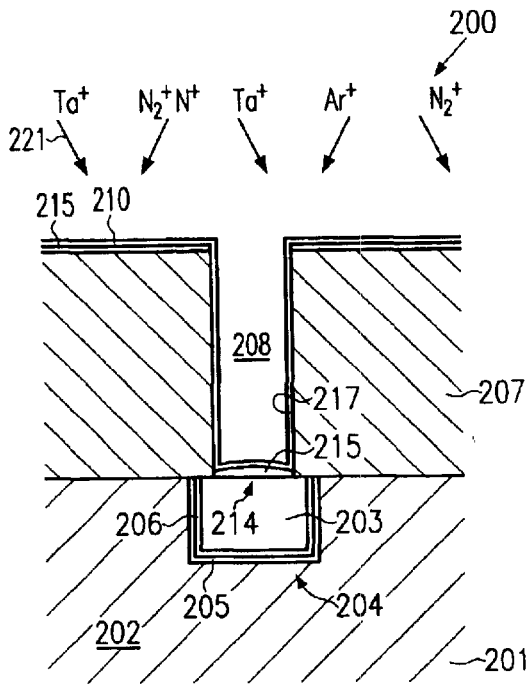

FIG. 2b schematically shows the situation described above, wherein a deposition ambient 221 is created for depositing tantalum nitride on the substrate 201, wherein the deposition selectivity, i.e., the bottom coverage, is significantly reduced. Thus, a tantalum nitride layer 210 is formed on the sidewalls 217 and at the bottom of the vias 208, wherein a thickness of the layer 210 on the sidewalls 217 may be significantly greater than at the bottom of the via 208.

Figure 1C:
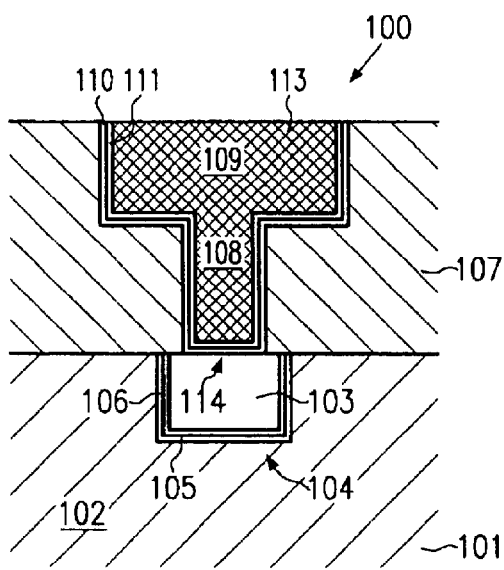
Figure 2C:
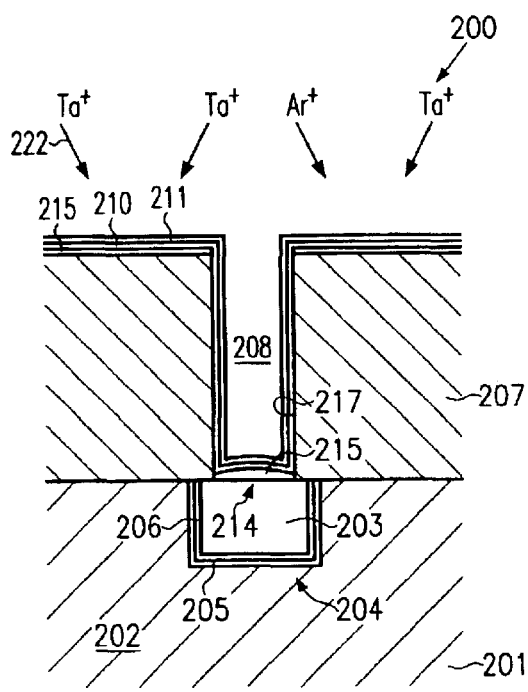

FIG. 2c schematically shows the metallization structure 200 with a second barrier layer 211 formed in a substantially conformal manner so that a thickness thereof on the sidewalls 217 is comparable to a thickness at the bottom of the via 208. For depositing the second barrier layer 211, the supply of nitrogen into the process chamber 307 may be discontinued and the bias voltage, possibly in combination with the chamber pressure, may be adjusted so as to obtain the required deposition characteristics in the deposition ambient 221. Hence, at the interface 214, the metal region 203, comprising, for example, copper, is in direct contact with the bottom barrier layer 215, substantially comprising tantalum, followed by the tantalum nitride layer 210, and finally by the tantalum layer 211. As a consequence, the adhesion properties at the interface 214 are considerably improved compared to a conventional via as, for example, shown in FIG. 1c.

Figure 1B:
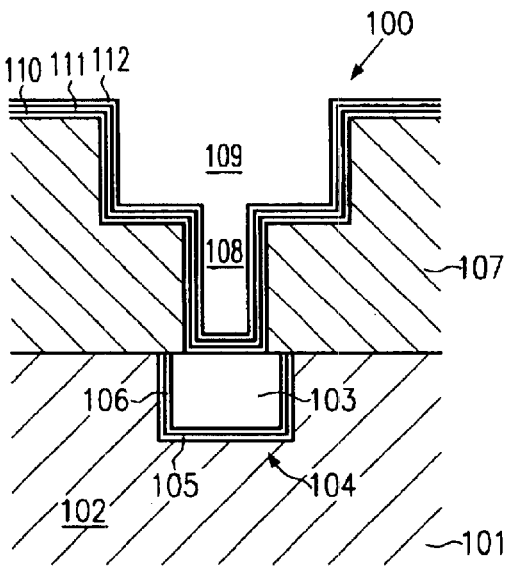

After formation of the barrier layers 215, 210 and 211, the further process sequence may be continued as already described with reference to FIGS. 1b and 1c to finally obtain a via 208 filled with copper, wherein excellent adhesion characteristics arc obtained at all interfaces of the via 208 to the adjacent materials.

In some applications, it may be advantageous to further optimize the electrical transition resistance between the copper in the via 208 and the copper in the metal region 203 by reducing the thickness of the barrier layer 210, i.e., the tantalum nitride layer at the bottom of the via 208.

Figure 2D:
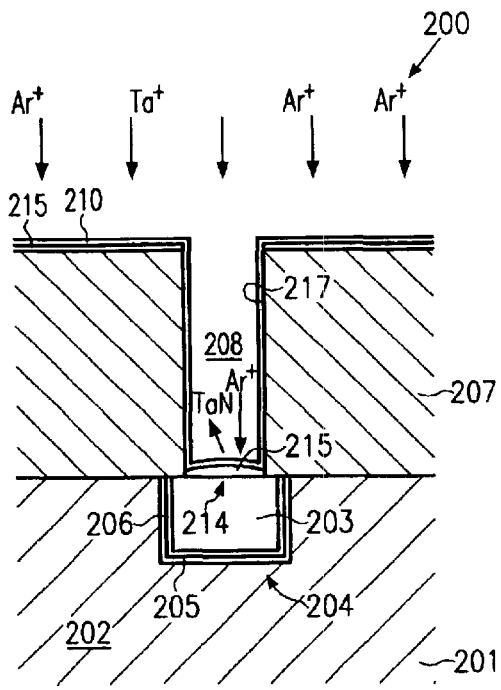

FIG. 2d schematically shows the metallization structure 200 in accordance with a further embodiment, wherein, starting from the configuration as shown in FIG. 2b, the thickness of the tantalum nitride layer 210 may be reduced at the bottom of the via 208 by performing a re-sputtering process with an appropriately high bias voltage to obtain a substantial perpendicular incidence of the oncoming ions. For example, by appropriately controlling the plasma generating means 302 and the bias voltage applied to the sputter target 303, the amount of liberated tantalum atoms may be reduced so that significantly more argon ions are involved in re-sputtering tantalum nitride from the bottom of the via 208 to the sidewalls 217 thereof. After removing a sufficient amount of tantalum nitride from the bottom of the via 208, the manufacturing process may be resumed as described with reference to FIG. 2c to finally obtain a copper interconnect having a reduced resistivity due to the reduced thickness of the tantalum nitride layer 210 at the via bottom. As previously noted with respect to process parameters during the sputter deposition of the layers 215, 210 and 211, an appropriate parameter setting may be obtained for a specified deposition tool by experiment, wherein the bias voltage and the chamber pressure may represent the dominant variables.

Figure 4A:
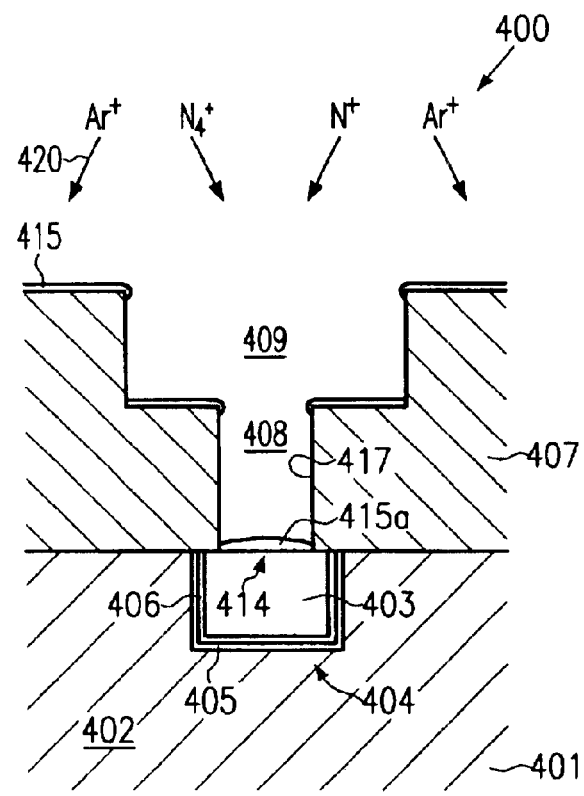
FIGS. 4a–4b schematically depict a dual damascene metallization structure in accordance with still further illustrative embodiments of the present invention.
Figure 4B:
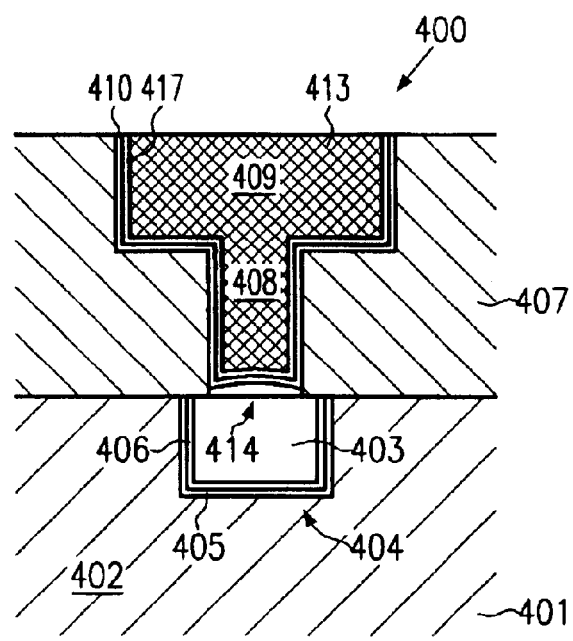

With reference to FIGS. 4a–4b, further illustrative embodiments of the present invention will now be described. In FIG. 4a, a metallization structure 400 comprises a substrate 401 including a first dielectric layer 402 with a metal line 404 formed therein. The metal line 404 may comprise a copper region 403 confined by first and second barrier layers 405 and 406, similar to those as previously described with reference to FIGS. 1a and 2a. A second dielectric layer 407 is formed above the first dielectric layer 402 with a via 408 and a trench 409 formed in the second dielectric layer 407. A bottom barrier layer 415 is formed substantially on horizontal surface portions of the structure 400.

Regarding the formation of the metallization structure 400 as shown in FIG. 4a, similar process steps as already described with reference to FIG. 1a and with respect to the formation of the bottom barrier layer 215, as described with reference to FIG. 2a, may be applied. In some applications, the provision of the bottom barrier layer 415 directly on the second dielectric layer 407, indicated by 415a, may be considered as inappropriate, and therefore a re-sputtering process may be carried out in a deposition atmosphere 420 in the presence of substantially argon and nitrogen ions, wherein the process parameters and, in particular, the bias voltage applied between the substrate 401 and the ionization means 305 is adjusted so as to obtain a substantially non-oriented ion bombardment. Consequently, the thickness of the bottom barrier layer 415a provided at the bottom of a relatively wide opening compared to the via 408 and having a comparatively low aspect ratio is significantly reduced, whereas the bottom barrier layer 415 within the via 408 is insignificantly affected by the re-sputtering process. The re-sputtering process may be discontinued once a desired reduction of the thickness of the layer 415a, or even a substantially complete removal thereof, is achieved. In other embodiments, the deposition of the bottom barrier layer 415a, having a reduced adhesion to the dielectric layer 407, may be acceptable since the remaining sidewalls remain substantially uncovered and may then be coated with a tantalum nitride layer having excellent adhesion to the dielectric layer 407. Thus, the slight reduction in the overall mechanical stability may be acceptable in some applications. Irrespective of the embodiments used, the further processing may be resumed as described with reference to FIGS. 2b and 2c.

FIG. 4b schematically shows the metallization structure 400 after the formation of a first barrier layer 410, comprised of tantalum nitride substantially formed on sidewalls 417 within the via 408 and the trench 409, followed by a second barrier layer 411 substantially comprised of tantalum. Moreover, the via 408 and the trench 409 are filled with copper 413 with any excess material of the barrier layers 415, 410 and 411 and the copper 413 removed by chemical mechanical polishing. Thus, the metallization structure 400 represents a copper interconnect formed in accordance with the dual damascene technique, wherein substantially all of the interfaces between copper and a barrier layer are formed by a tantalum/copper interface exhibiting excellent adhesion characteristics. It should be noted that the transition resistance from the via 408 to the metal region 403 may be reduced by reducing the thickness of the layer 410 at the bottom of the via 408 as is described with reference to FIG. 2d so that mechanically extremely stable copper interconnects may be obtained that exhibit an extremely low transition resistance compared to the conventional metallization structure as shown in FIG. 1c.

As a result, by exploiting the superior characteristics of modern ionizing physical vapor deposition tools, i.e., by adjusting the directionality of ions onto a substrate, metal interconnects may be formed wherein substantially all of the surfaces of trenches and/or vias may receive a barrier component allowing a maximum degree of adhesion. Furthermore, the resistivity from one metal region to a neighboring metal region may be optimized by reducing the thickness of a barrier component having an increased resistivity compared to a second barrier component.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a barrier layer in an interconnect structure formed on a substrate, the method comprising:
   adjusting a direction of target atoms in a deposition ambient by ionizing a fraction of said target atoms, and applying a bias voltage to said interconnect structure so as to predominantly deposit target ions on a bottom surface of said interconnect structure to form a bottom barrier layer;
   changing a composition of said deposition ambient while reducing said bias voltage to deposit a second barrier layer on sidewalls of said interconnect structure;
   substantially re-establishing said deposition ambient; and
   conformally depositing target atoms to form a third barrier layer over said bottom barrier layer and said second barrier layer.

2. The method of claim 1, wherein said deposition ambient comprises tantalum.

3. The method of claim 1, wherein at least a fraction of said target atoms is liberated from a sputter target.

4. The method of claim 1, wherein adjusting a direction of said target atoms further includes controlling a pressure of a deposition atmosphere surrounding said target and said substrate.

5. The method of claim 1, wherein adjusting a direction of said target atoms further includes controlling at least one of a substrate temperature and geometry factor during the deposition of said target atoms.

6. The method of claim 1, wherein said bias voltage is applied for approximately 1–5 seconds.

7. The method of claim 6, wherein a thickness of said bottom barrier layer is in the range of approximately 1–5 nm.

8. The method of claim 1, further comprising re-sputtering a portion of said second barrier layer prior to depositing said third barrier layer.

9. The method of claim 1, further comprising determining an amount of said bias voltage for a specified deposition tool and a given set of process parameters prior to adjusting the direction of said target atoms.

10. The method of claim 9, wherein said process parameters include at least one of a pressure of said deposition ambient, a temperature of said substrate, an ionization power for ionizing said target atoms and a magnetic field prevailing in said deposition ambient.

11. The method of claim 1, wherein said deposition ambient is changed by adding nitrogen.

12. The method of claim 1, wherein said interconnect structure includes a trench and a via formed therein, and said method further comprises re-sputtering a portion of material of said bottom barrier layer prior to forming said second barrier layer.

13. A method of forming a tantalum-based barrier layer, the method comprising:
depositing tantalum by ionizing physical vapor deposition primarily at a bottom surface of a via formed in a dielectric layer of a metallization structure; and
depositing a tantalum nitride/tantalum bi-layer on sidewalls of said via.

14. The method of claim 13, wherein said physical vapor deposition includes applying a bias voltage to said metallization structure to direct tantalum atoms liberated from a sputter target substantially perpendicularly to said bottom surface.

15. The method of claim 14, further including controlling a pressure of a deposition atmosphere during said physical vapor deposition.

16. The method of claim 14, further including controlling at least one of a substrate temperature and geometry factor during the physical vapor deposition.

17. The method of claim 14, wherein said bias voltage is applied for approximately 1–5 seconds.

18. The method of claim 13, wherein a bottom barrier layer is formed during the physical vapor deposition and a thickness of said bottom barrier layer is in the range of approximately 1–5 nm.

19. The method of claim 13, further comprising re-sputtering a portion of the tantalum atoms prior to depositing a tantalum nitride/tantalum bi-layer.

20. The method of claim 14, further comprising determining an amount of said bias voltage for a specified deposition tool and a given set of process parameters prior to depositing tantalum ions.

21. The method of claim 20, wherein said process parameters include at least one of a pressure of said deposition ambient, a temperature of said metallization structure, an ionization power for ionizing said tantalum atoms and a magnetic field prevailing in said deposition ambient.

22. The method of claim 13, wherein said tantalum nitride/tantalum bi-layer is deposited by ionized physical vapor deposition.

23. The method of claim 13, wherein said tantalum ions and said tantalum nitride/tantalum bi-layer are deposited in a common process chamber without breaking a vacuum established therein.

24. The method of claim 13, wherein said metallization structure includes a trench and a via formed therein, and said method further comprises re-sputtering a portion of tantalum atoms deposited on a bottom surface of said trench prior to depositing said tantalum nitride/tantalum bi-layer.

* * * * *

UNITED STATES PATENT AND TRADEMARK OFFICE
CERTIFICATE OF CORRECTION

PATENT NO. : 6,841,468 B2
DATED : January 11, 2005
INVENTOR(S) : Michael Friedemann and Volker Kahlert It is certified that error appears in the above-identified patent and that said Letters Patent is hereby corrected as shown below:

Title page,
Item [54], Title, "IMPROVE" should be -- IMPROVED --.

Column 12,
Line 38, please insert the following claim 25:
    25.   The method of claim 1, wherein said bottom barrier layer comprises tantalum, said second barrier layer comprises tantalum nitride and said third barrier layer comprises tantalum.

Signed and Sealed this

Fourteenth Day of June, 2005

JON W. DUDAS
*Director of the United States Patent and Trademark Office*